(12) United States Patent
Chojnacki et al.

(10) Patent No.: US 10,459,157 B2
(45) Date of Patent: Oct. 29, 2019

(54) OPTICAL EMITTER PACKAGES

(71) Applicant: Analog Devices, Inc., Norwood, MA (US)

(72) Inventors: Eric P. Chojnacki, Pelham, NH (US); Michael J. Zylinski, Haverhill, MA (US); Erik D. Barnes, Cambridge, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/674,814

(22) Filed: Aug. 11, 2017

(65) Prior Publication Data

US 2018/0045882 A1 Feb. 15, 2018

Related U.S. Application Data

(60) Provisional application No. 62/420,477, filed on Nov. 10, 2016, provisional application No. 62/374,594, filed on Aug. 12, 2016.

(51) Int. Cl.

| | |
|---|---|
| *G02B 6/02* | (2006.01) |
| *G02B 6/12* | (2006.01) |
| *G02B 6/35* | (2006.01) |
| *G02B 6/42* | (2006.01) |
| *H04B 10/50* | (2013.01) |
| *F21V 8/00* | (2006.01) |
| *G01S 7/481* | (2006.01) |

(Continued)

(52) U.S. Cl.
CPC ........ *G02B 6/02209* (2013.01); *G01S 7/4814* (2013.01); *G02B 6/0081* (2013.01); *G02B 6/12019* (2013.01); *G02B 6/3598* (2013.01); *G02B 6/4236* (2013.01); *H01S 5/02244* (2013.01); *H01S 5/042* (2013.01); *H04B 10/50* (2013.01); *H01S 5/02272* (2013.01); *H01S 5/02276* (2013.01); *H01S 5/02469* (2013.01); *H01S 5/0428* (2013.01)

(58) Field of Classification Search
CPC .................................................. G02B 6/02209
See application file for complete search history.

(56) References Cited

U.S. PATENT DOCUMENTS

| | | |
|---|---|---|
| 3,840,889 A | 10/1974 | O'Brien et al. |
| 6,507,594 B1 | 1/2003 | Furukawa et al. |
| | (Continued) | |

FOREIGN PATENT DOCUMENTS

| | | |
|---|---|---|
| CN | 1331494 A | 1/2002 |
| CN | 102640369 A | 8/2012 |
| | (Continued) | |

*Primary Examiner* — William A Harriston
(74) *Attorney, Agent, or Firm* — Wolf, Greenfield & Sacks, P.C.

(57) ABSTRACT

An optical emitter package is disclosed. The optical emitter package can include a carrier, a switching die, and an optical emitter die mounted to the carrier. The optical emitter die can be directly electrically and mechanically connected to the carrier with a conductive adhesive. An energy storage device can be mounted to the carrier. The energy storage device can be directly electrically and mechanically connected to the carrier with a second conductive adhesive. The carrier can provide electrical communication between the switching die, the optical emitter die, and the energy storage device.

24 Claims, 8 Drawing Sheets

(51) Int. Cl.
*H01S 5/022* (2006.01)
*H01S 5/042* (2006.01)
*H01S 5/024* (2006.01)

(56) References Cited

U.S. PATENT DOCUMENTS

| | | |
|---|---|---|
| 6,757,309 B1 | 6/2004 | Karpinski |
| 7,061,949 B1 | 6/2006 | Zhou et al. |
| 7,385,229 B2 | 6/2008 | Venugopalan |
| 8,059,057 B2 | 11/2011 | Mason et al. |
| 8,848,757 B2 | 9/2014 | Joseph |
| 8,888,331 B2 | 11/2014 | Mandelboum et al. |
| 9,086,275 B2 | 7/2015 | Weinberg et al. |
| 2005/0047455 A1 | 3/2005 | Tanaka |
| 2005/0048455 A1* | 3/2005 | Hayamizu ............ G09B 23/288 434/262 |
| 2005/0074046 A1* | 4/2005 | Kasai .................. H01S 5/02212 372/50.1 |

FOREIGN PATENT DOCUMENTS

| | | |
|---|---|---|
| CN | 203326357 U | 12/2013 |
| CN | 103796421 A | 5/2014 |
| CN | 103891065 A | 6/2014 |
| CN | 105378930 A | 3/2016 |
| CN | 105793979 A | 7/2016 |
| JP | 2000-164970 A | 6/2000 |
| JP | 2004-103870 A | 4/2004 |

\* cited by examiner

OPTICAL EMITTER PACKAGES

CROSS-REFERENCE TO RELATED APPLICATIONS

This application claims priority to U.S. Provisional Patent Application No. 62/374,594, filed Aug. 12, 2016, and claims priority to U.S. Provisional Patent Application No. 62/420,477, filed Nov. 10, 2016, the entire contents of each of which are hereby incorporated by reference in their entirety and for all purposes.

BACKGROUND

Field

The field relates to optical emitter packages, and in particular, to laser diode packages.

Description of the Related Art

Optical emitter packages include an optical emitter die and various electronic components that control the operation of the optical emitter die. In Light Detection and Ranging (LIDAR) systems, it can be important to provide high frequency switching to the optical emitter die so that the performance of the laser is improved. There remains a continuing need for improved optical emitter packages.

SUMMARY

In one embodiment, an optical emitter package is disclosed. The optical emitter package can include a carrier, a switching die, and an optical emitter die mounted to the carrier. The optical emitter die can be electrically and mechanically connected (e.g., directly mechanically and electrically connected in various embodiments) to the carrier with a conductive adhesive. An energy storage device can be mounted to the carrier. The energy storage device can be electrically and mechanically connected (e.g., directly mechanically and electrically connected in various embodiments) to the carrier with a second conductive adhesive. The carrier can provide electrical communication among the switching die, the optical emitter die, and the energy storage device.

In some embodiments, an interconnect structure comprises a conductive trace, the interconnect structure electrically connecting to the optical emitter die by a third conductive adhesive and to the switching die by a fourth conductive adhesive.

In another embodiment, an optical emitter package is disclosed. The optical emitter package can include a carrier, an interconnect structure comprising a conductive trace, a switching die, and an optical emitter die having a first side and a second side opposite the first side. The first side of the optical emitter die can be mechanically and electrically connected to the carrier with a conductive adhesive. The second side of the optical emitter die can be mechanically and electrically connected to the interconnect structure with a second conductive adhesive. The interconnect structure can provide electrical communication between the switching die and the optical emitter die.

In some embodiments, the optical emitter package can include an energy storage device mounted to the carrier, the energy storage device being in electrical communication with the switching die and the optical emitter die. The energy storage device can comprise a capacitor. In some embodiments, the package can comprise a second interconnect structure, wherein a first side of the energy storage device is mechanically and electrically connected to the carrier and a second side of the energy storage device is mechanically and electrically connected to the second interconnect structure. In some embodiments, the interconnect structure is mechanically and electrically connected to the switching die. In some embodiments, the carrier comprises a package substrate, the switching die mechanically and electrically connected to the package substrate. In some embodiments, a first side of the switching die is electrically and mechanically connected to the package substrate and a second side of the switching die is electrically and mechanically connected to the interconnect structure. In some embodiments, the package substrate comprises a leadframe. In some embodiments, the package substrate comprises a laminate substrate. In some embodiments, the switching die and the optical emitter die are mounted adjacent one another on the carrier. In some embodiments, the carrier comprises the switching die such that the optical emitter die is disposed on the switching die. In some embodiments, the interconnect structure comprises a ribbon interconnect. In some embodiments, the interconnect structure comprises an interposer. In some embodiments, the interposer comprises a laminate substrate. In some embodiments, the interposer comprises a flexible substrate. In some embodiments, the flexible substrate is bent so as to be disposed along a surface of the carrier. The optical emitter die can include a laser diode. In some embodiments, the switching die comprises switching circuitry that relays current between the energy storage device and the optical emitter die.

In some embodiments, the package can comprise a current pathway passing between the energy storage device and the carrier, between the carrier and the switching die, between the switching die and the carrier, between the carrier and the optical emitter die, between the optical emitter die and the interconnect structure, between the interconnect structure and the switching die, between the switching die and the carrier, and between the carrier and the energy storage device.

In some embodiments, the package can comprise a current pathway passing between the energy storage device and the second interconnect structure, between the second interconnect structure and the switching die, between the switching die and the interconnect structure, between the interconnect structure and the optical emitter die, between the optical emitter die and the carrier, and between the carrier and the energy storage device.

In some embodiments, the package can include a current pathway passing between the energy storage device and the second interconnect structure, between the second interconnect structure and the switching die, between the switching die and the interconnect structure, between the interconnect structure and the optical emitter die, between the optical emitter die and the carrier, between the carrier and the switching die, between the switching die and the second interconnect structure, and between the second interconnect structure and the energy storage device.

In some embodiments, a width of the conductive trace is greater than 30 microns. In some embodiments, the width of the conductive trace is in a range of 40 microns to 1,000 microns. In some embodiments, the width of the conductive trace is in a range of 50 microns to 500 microns. In some embodiments, the width of the conductive trace is in a range of 75 microns to 250 microns.

In another embodiment, an optical emitter package is disclosed. The optical emitter package can include a switching die and an energy storage device mechanically and electrically connected (e.g., directly mechanically and electrically connected in various embodiments) to the switching die by way of a first conductive adhesive. The optical emitter package can include an optical emitter die mechanically and electrically connected (e.g., directly mechanically and electrically connected in various embodiments) to the switching die by way of a second conductive adhesive. The switching die can provide electrical communication between the energy storage device and the optical emitter die.

In some embodiments, the energy storage device comprises a capacitor. In some embodiments, the optical emitter die is mounted such that a side surface of the optical emitter die faces the switching die. In some embodiments, the package comprises a first bump which mechanically and electrically connects the switching die with a first side of the optical emitter die and a second bump which mechanically and electrically connects the switching die with a second side of the optical emitter die. In some embodiments, the package can include a current pathway passing between the energy storage device and the switching die, between the switching die and the optical emitter die, between the optical emitter die and the switching die, and between the switching die and the energy storage device.

In some embodiments, the optical emitter die comprises a laser diode. In some embodiments, the optical emitter die comprises a vertical cavity surface emitting laser (VCSEL). In some embodiments, the optical emitter die comprises a side-emitting laser diode. In some embodiments, the package comprises a package substrate, the switching die being mounted to the package substrate. In some embodiments, the carrier comprises an interposer disposed between the switching die and the optical emitter die. In some embodiments, the interposer is disposed between the switching die and the optical emitter die. In some embodiments, the interposer comprises a heat sink to dissipate heat from the optical emitter die to the outside environs. In some embodiments, the interposer comprises one or a plurality of vias to provide electrical communication between the optical emitter die and the switching die and between the energy storage device and the switching die. In some embodiments, a width of the one or plurality of vias is in a range of 50 microns to 2 mm.

In some embodiments, the package comprises a current pathway between the energy storage device and the interposer, between the interposer and the optical emitter die, between the optical emitter die and the switching die, and between the switching die and the energy storage device.

In some embodiments, the package comprises a package substrate, the switching die mounted to the package substrate such that the switching die is disposed between the package substrate and the interposer. In some embodiments, the carrier comprises a package substrate, and wherein each of the switching die, the optical emitter die, and the energy storage device are directly electrically and mechanically connected to the package substrate by conductive adhesive. In some embodiments, the package substrate comprises a plurality of conductive sheets to provide electrical communication between the switching die, the optical emitter die, and the energy storage device. In some embodiments, a width of the plurality of conductive sheets is in a range of 50 microns to 2 mm.

In some embodiments, the package comprises a current pathway between the energy storage device and the package substrate, between the package substrate and the optical emitter die, between the optical emitter die and the package substrate, between the package substrate and the switching die, between the switching die and the package substrate, and between the package substrate and the energy storage device.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

Specific implementations of the invention will now be described with reference to the following drawings, which are provided by way of example, and not limitation.

DETAILED DESCRIPTION

Figure 1A:
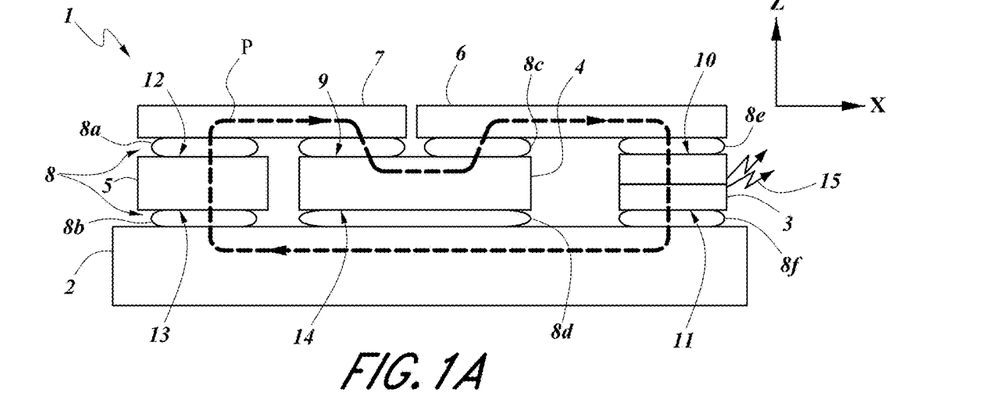
FIG. 1A is a schematic side view of an optical emitter package, according to one embodiment.
Figure 1B:
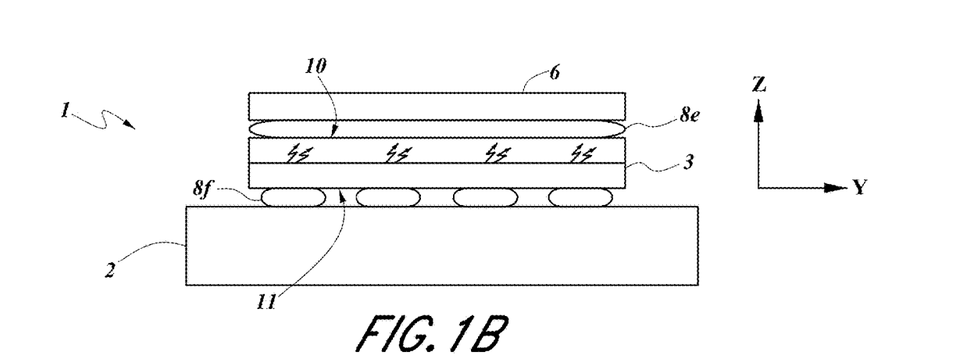
FIG. 1B is a schematic end view of the optical emitter package of FIG. 1A, as viewed from a transverse direction relative to the view of FIG. 1A, according to one embodiment.
Figure 1C:
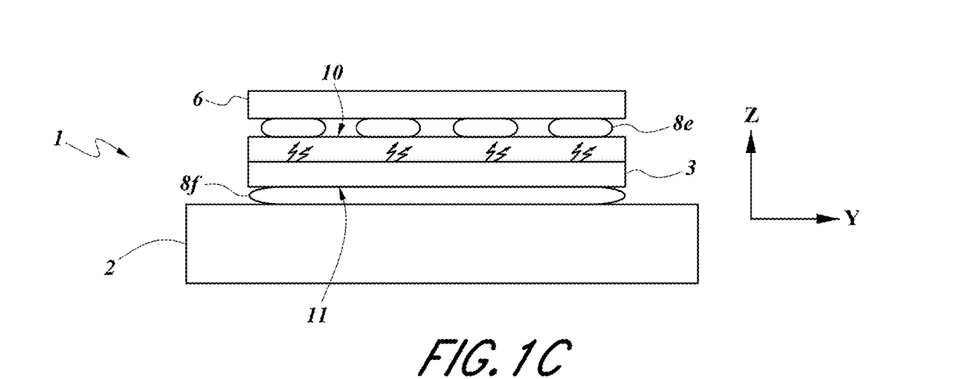
FIG. 1C is a schematic end view of the optical emitter package of FIG. 1A, as viewed from a transverse direction relative to the view of FIG. 1A, according to another embodiment.

FIG. 1A is a schematic side view of an optical emitter package 1, according to one embodiment. FIG. 1B is a schematic side view of the optical emitter package 1 of FIG. 1A, as viewed from a transverse direction relative to the view of FIG. 1A, according to one embodiment. FIG. 1C is a schematic side view of the optical emitter package 1 of FIG. 1A, as viewed from a transverse direction relative to the view of FIG. 1A, according to another embodiment. The package 1 can include a package substrate 2 that is configured to be mounted to a system board. The package substrate 2 in FIG. 1A may be any suitable type of substrate, such as a leadframe substrate, a laminate substrate (e.g., a printed circuit board, or PCB), a ceramic substrate, etc.

Various embodiments disclosed herein relate to optical emitter packages that are configured to reduce the inductance of electrical interconnects between an optical emitter die and other package components. In various types of optical systems, such as LIDAR systems, the performance of the laser (e.g., the pulse width and/or pulse frequency) may be limited by the inductance introduced by the electrical interconnects. For example, some LIDAR systems may include an optical emitter die (e.g., a laser diode die), a switching die (e.g., a power switch die, an Application Specific Integrated Circuit, or ASIC), and an energy storage device such as a capacitor. The switching die may comprise circuitry configured to switch current on and off. In some embodiments, the switching die can comprise additional active processing circuitry to perform various functions. The switching die and the capacitor may be wire bonded to a leadframe or other substrate by way of thin bonding wires. The laser diode may be wire bonded to the leadframe or to the switching die by way of thin bonding wires. The bonding wires used to electrically connect the components in a typical LIDAR package may have relatively small lateral dimensions, e.g., a width of about 25 microns. The small bonding wires may act as a choke point (e.g., increase the inductance) for current surges that are used to pulse the laser at high speeds. For example, in some optical packages, the increased inductance may limit the supplied power levels to 20 W or less with relatively high pulse durations.

Some optical emitter packages (e.g., LIDAR systems) may employ complex circuitry patterned in the switching die in order to address this increased inductance. Such complex circuitry may enable higher frequency LIDAR packages. U.S. Patent Publication No. 20170085057, which is hereby incorporated by reference in its entirety and for all purposes, illustrates various examples of optical emitter systems (including LIDAR) and circuit drivers therefor. Embodiments disclosed herein provide packaging solutions that cooperate with LIDAR dies configured for high frequency operation.

Other types of packages, such as radio frequency packages, may experience relatively high inductance in some instances. However, these other packages may operate with continuous wave, steady state signaling, in which the inductance is smoothed out during operation. Since such continuous wave systems do not generate high power, low duration pulses, the inductance in such packages and systems does not appreciably choke the supplied current, such that the system performance is not significantly degraded.

Advantageously, the embodiments disclosed herein reduce the inductance at the package level, which enables higher power and lower pulse duration for optical emitter systems. Moreover, the embodiments disclosed herein can beneficially enable the use of relatively simple and inexpensive switching dies, such as processors that utilize power field effect transistors (FETs). For example, in various embodiments, interconnect structures may be provided on packaging substrates to provide electrical communication among an energy storage device (e.g., a capacitor), a switching die, and a optical emitter die. The interconnect structure may comprise one or more conductive traces, and in some embodiments a width of the trace(s) being significantly larger than a width of conventional bonding wires. The traces can be formed of relatively wide sheet(s) of conductive material, sufficiently wide so as to provide a low-inductance pathway relative to the employment of bond wires, e.g., the sheet(s) of conductive material can have minimum widths in a range of 40 µm to 2 mm, in a range of 50 µm to 1 mm, in a range of 100 µm to 2 mm, in a range of 100 µm to 1 mm, in a range of 250 µm to 2 mm, in a range of 250 µm to 1 mm, or in a range of 500 µm to 2 mm. In various embodiments, the minimum width(s) of the conductive sheet(s) can be greater than 40 µm, greater than 50 µm, greater than 100 µm, greater than 250 µm, or greater than 500 µm. The increased trace width may advantageously reduce the package inductance, which can improve the performance of the LIDAR system. Although the illustrated embodiments are disclosed in connection with LIDAR systems, it should be appreciated that the embodiments may be used in connection with other optical packages.

In FIG. 1A, an energy storage device 5, a switching die 4, and an optical emitter die 3 can be mounted to an upper surface of the substrate 2 by way of respective adhesives. The switching die 4 may comprise circuitry configured to switch current on and off. In some embodiments, the switching die 4 can comprise additional active processing circuitry to perform various functions. In some embodiments, the switching die may comprise a plurality of switching dies. As shown in FIG. 1A, the energy storage device 5 may be disposed adjacent the switching die 4. The energy storage device 5 may comprise, e.g., a surface mount capacitor or an inductor. In the illustrated embodiment, for example, the energy storage device 5 comprises a capacitor. In other embodiments, the energy storage device may be integrated with one or more of the dies or packaging substrate(s) of the system. The switching die 4 may be disposed adjacent the optical emitter die 3. Thus, in FIG. 1A, the package substrate 2 may act as a carrier for the energy storage device 5, the switching die 4, and the optical emitter die 3. In the embodiment of FIG. 1A, a first interconnect structure 6 can serve to electrically connect the switching die 4 and the optical emitter die 3. A second interconnect structure 7 can serve to electrically connect the energy storage device 5 and the switching die 4. The energy storage device 5 of FIG. 1A is a capacitor, which may comprise any suitable type of capacitive device. The switching die 4 can comprise any suitable type of integrated circuit die, such as an Application Specific Integrated Circuit die, or ASIC. The switching die 4 can comprise a base die substrate (e.g., formed of a semiconductor material such as silicon) and one or a plurality of layers of electronic circuitry patterned in the base die substrate. For example, the switching die 4 can comprise switching circuitry that controls the amount, timing, and/or frequency of electrical current that is supplied to the optical emitter die 3. The switching circuitry of the switching die 4 can comprise one or more power field effect transistors (FETs). The optical emitter die 3 can comprise any suitable type of emitter, such as a laser diode.

As shown in FIG. 1A, a first terminal on a first side 11 of the optical emitter die 3 can be directly electrically and mechanically connected to the carrier 2 by way of adhesive 8f. A second terminal on a second side 10 of the optical emitter die 3 can be directly electrically and mechanically connected to the first interconnect structure 6 by way of adhesive 8e. The conductive adhesive 8 used to directly mechanically and electrically connect the components may comprise a conductive material, such as a conductive die attach material, e.g., a conductive epoxy. In other embodiments, the conductive adhesive 8 may comprise solder. Each of the energy storage device 5, the switching die 4, and the emitter die 3 may be connected to the respective components by the same type of adhesive in some embodiments. In other embodiments, different adhesive types may be used for different connections.

In FIG. 1A, the switching die 4 can be mounted with an active surface 9 of the die 4 facing the first and second interconnect structures 6, 7. A back surface 14 of the switching die 4 can be mounted to the package substrate 2 by way of adhesive 8d. Each of the first and second interconnect structures 6, 7 can directly electrically and mechanically connect to the active surface 9 of the switching die 4 by way of adhesives 8c. The energy storage device 5 can comprise a first terminal on a first side 13 of the energy storage device 5 that is directly electrically and mechanically connected to the package substrate 2 by way of adhesive 8b, and a second terminal on a second side 12 of the energy storage device 5 that is directly electrically and mechanically connected to the second interconnect structure 7 by way of adhesive 8a.

The interconnect structures 6, 7 shown in FIG. 1A can provide reduced inductance as compared with bonding wires. The interconnect structures 6, 7 may take various forms, but as they electrically and mechanically connect to multiple dies and/or surface mount devices, the interconnect structures may be considered packaging substrates and may similarly take any form as conventional carriers on or in which relatively wide traces or equivalent metal lines can be formed. For example, the interconnect structures 6, 7 can comprise ribbon interconnects, flexible substrates, or more rigid substrates, such as molded leadframe substrates, laminate substrates (e.g., PCB), ceramic substrates, etc. Advantageously, the interconnect structures 6, 7 can include one or more relatively wide conductive traces or other metal lines, particularly wider than bonding wires. For example, a ribbon interconnect can include one or more conductors (e.g., traces) that are embedded in or otherwise disposed within an insulating sheath or cover. An interposer or other substrate may comprise one or more conductive traces patterned or layered in an insulating material. The interconnect structures 6, 7 can comprise trace(s) that have a width larger than a width or diameter of conventional bonding wires (which may have widths of approximately 25 microns). For example, in the illustrated embodiments, the interconnect structures 6, 7 can comprise one or more conductive traces that have a width greater than 30 microns. In some embodiments, the width of the conductive trace can be in a range of 40 μm to 1 mm, more particularly, in a range of 50 μm to 500 μm, e.g., in a range of 75 μm to 250 μm. Beneficially, the use of relatively wide conductors in the interconnect structures 6, 7 can enable a significantly reduced inductance as compared with packages that utilize bonding wires.

FIG. 1A illustrates a conductive pathway P that defines a closed current loop during operation of the package 1. For example, the energy storage device 5 can be charged to a high voltage. When the voltage exceeds the breakdown voltage of the energy storage device 5 (such as when the energy storage device 5 comprises a capacitor), a surge of current passes through a second terminal on the second side 12 of the energy storage device 5, the second interconnect structure 7, and into the switching die 4. Switching circuitry at or near the active surface 9 of the switching die 4 can be selectively opened so as to pass the current from the switching die 4, to the first interconnect structure 6, and into the second terminal on the second side 10 of the optical emitter die 3, which in the illustrated embodiment is a laser diode. The current can trigger the emission of light 15 at a junction of doped materials (e.g., at a P-N or P-I-N junction). As shown in FIG. 1A, the light 15 can be emitted out a side portion of the package 1, e.g., along the lateral x-direction. The current can pass between the optical emitter die 3 and the package substrate 2 through a first terminal on the first side 11 of the optical emitter die 3. The current can return to a first terminal on the first side 13 of the energy storage device 5. It should be appreciated that the direction of current in the pathway P is illustrative only, and the actual direction of current may be reversed.

Beneficially, the reduced inductance associated with the interconnect structures 6, 7 can enable faster switching speeds than implementations that use narrower electrical connections, such as conventional bonding wires. For example, the reduced inductance of the interconnect structures 6, 7 can enable switching speeds of 15 ns or less, 10 ns or less, 5 ns or less, or 1 ns or less. In some embodiments, the reduced inductance of the interconnect structures 6, 7 can enable switching speeds of 500 ps or less, or 100 ps or less. For example, the reduced inductance of the interconnect structures 6, 7 can enable switching speeds in a range of 30 ps to 15 ns, in a range of 30 ps to 10 ns, in a range of 30 ps to 5 ns, in a range of 50 ps to 5 ns, in a range of 50 ps to 1 ns, in a range of 50 ps to 500 ps, or in a range of 50 ps to 250 ps. The reduced switching time in the switching circuitry of the switching die 4 can beneficially improve the performance of the optical system, e.g., by reducing the pulse width of the laser.

Moreover, the reduced inductance associated with the disclosed embodiments can advantageously increase the power output to the optical emitter. For example, the disclosed embodiments enable peak power output through the package of above 80 W, e.g., above 100 W. For example, the disclosed embodiments can enable peak power outputs in a range of 70 W to 150 W, in a range of 70 W to 120 W, in a range of 80 W to 150 W, or in a range of 80 W to 120 W.

FIGS. 1B and 1C show alternative mounting arrangements for the optical emitter die 3. In FIG. 1B, the emitter die 3 (e.g., a laser diode die) can comprise a plurality of terminals on the first side 11 (e.g., a plurality of anodes or a plurality of cathodes), and a single common terminal on the second side 10 (e.g., a single cathode or a single anode). Alternatively, as shown in FIG. 1C, the emitter die 3 (e.g., a laser diode die) can comprise a plurality of terminals on the second side 10 (e.g., a plurality of anodes or a plurality of cathodes), and a single common terminal on the first side 11 (e.g., a single cathode or a single anode).

Figure 2A:
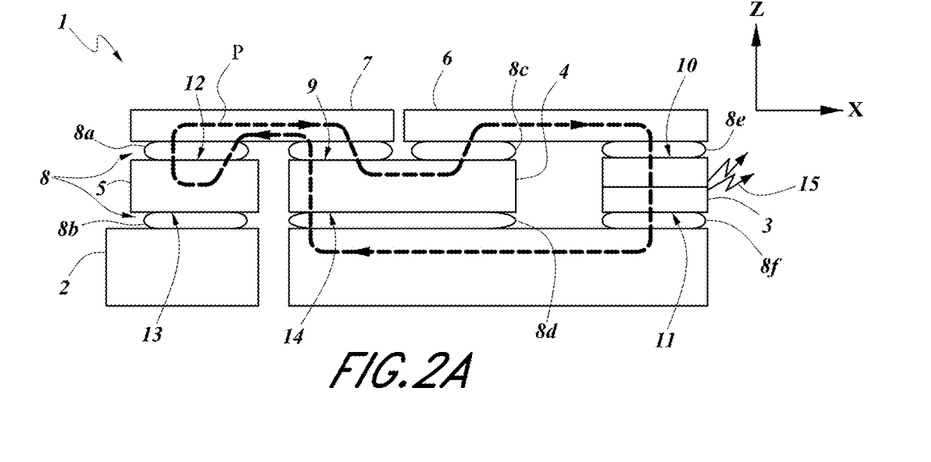
FIG. 2A is a schematic side view of an optical emitter package, according to another embodiment.
Figure 2B:
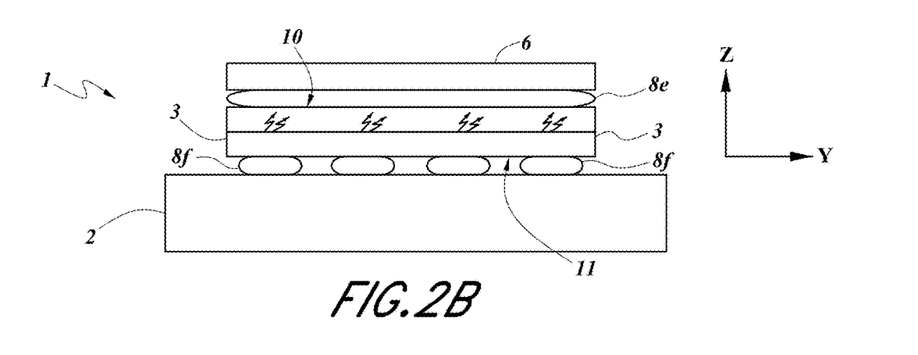
FIG. 2B is a schematic end view of the optical emitter package of FIG. 2A, as viewed from a transverse direction relative to the view of FIG. 2A, according to one embodiment.
Figure 2C:
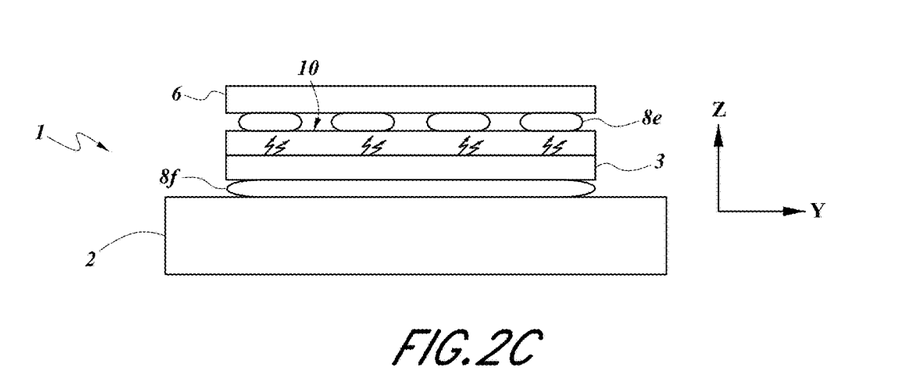
FIG. 2C is a schematic end view of the optical emitter package of FIG. 2A, as viewed from a transverse direction relative to the view of FIG. 2A, according to another embodiment.

FIGS. 2A-2C are schematic side views of an optical emitter package 1, according to another embodiment. Unless otherwise noted, the components of FIGS. 2A-2C are the same as or similar to like numbered components shown in FIGS. 1A-1C. Unlike the embodiment of FIGS. 1A-1C, however, the current may return to the energy storage device 5 by passing from the substrate 2, through the switching die 4, into the second interconnect structure 7, and into a terminal on the second side 12 of the energy storage device 5. Although not shown, the adhesive 8a may include separated electrical connections, such as solder balls, for the electrical path to and from the energy storage device 5. In some embodiments, for example, the energy storage device 5 may be mounted on a portion of the substrate 2 (e.g., a lead) which is separated from another portion of the substrate 2 (e.g., another lead or a die paddle) by a gap 16. Such a configuration enables very high conductivity leads, such as in a lead frame or molded lead frame, for the substrate 2.

In some embodiments, the current passing from the substrate 2 to the second interconnect structure 7 may be routed through the switching die 4 without the use of through-silicon vias (TSVs) or other metallization. Instead, the current may be sufficiently high so as to pass through the bulk substrate (e.g., bulk silicon or other semiconductor material) of the switching die 4 without the use of metallization or traces. While the resistivity of the bulk substrate of the process die is higher than the resistivity of metallic traces, the inductance is lower, which can improve the overall performance of the package 1. In other embodiments, the switching die 4 may include metallization to route signals through the thickness of the die 4.

FIGS. 2B and 2C show alternative mounting arrangements for the optical emitter die 3. In FIG. 2B, the emitter die 3 (e.g., a laser diode die) can comprise a plurality of terminals on the first side 11 (e.g., a plurality of anodes or a plurality of cathodes), and a single common terminal on the second side 10 (e.g., a single cathode or a single anode). Alternatively, as shown in FIG. 2C, the emitter die 3 (e.g., a laser diode die) can comprise a plurality of terminals on the second side 10 (e.g., a plurality of anodes or a plurality of cathodes), and a single common terminal on the first side 11 (e.g., a single cathode or a single anode).

Figure 3A:
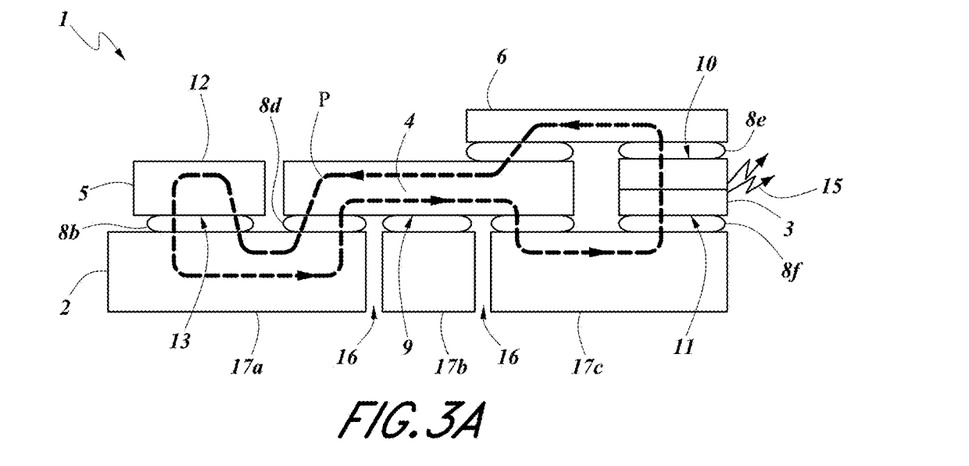
FIG. 3A is a schematic side view of an optical emitter package, according to another embodiment.
Figure 3B:
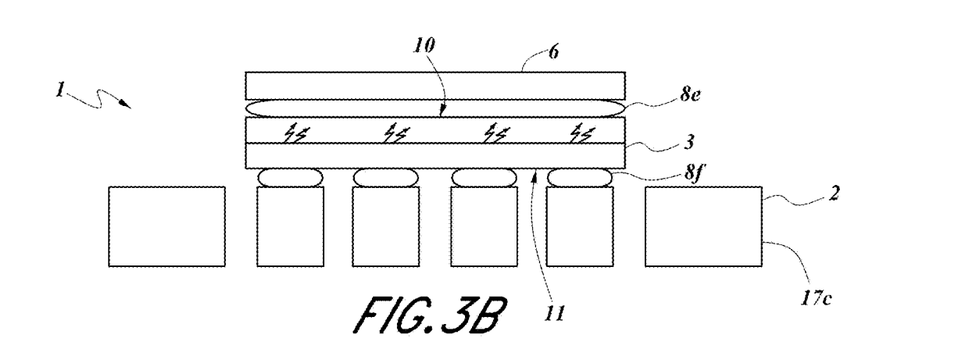
FIG. 3B is a schematic end view of the optical emitter package of FIG. 3A, as viewed from a transverse direction relative to the view of FIG. 3A, according to one embodiment.
Figure 3C:
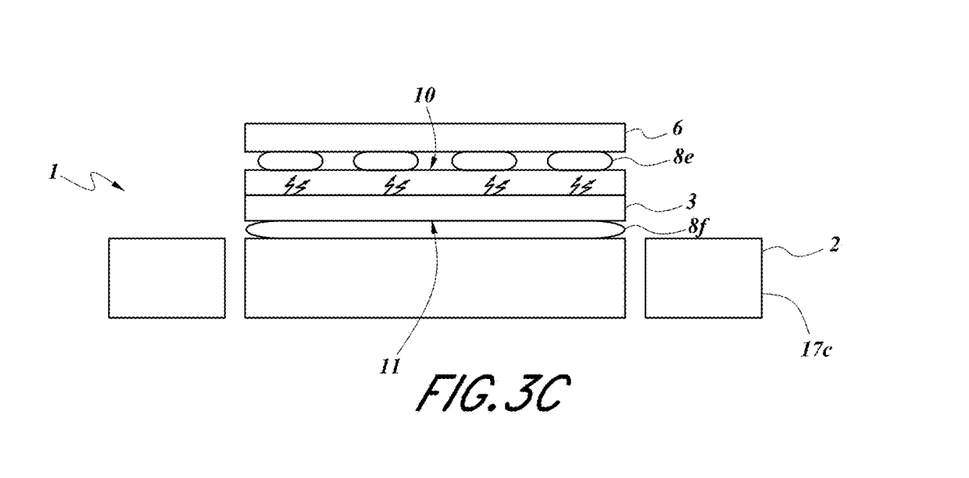
FIG. 3C is a schematic end view of the optical emitter package of FIG. 3A, as viewed from a transverse direction relative to the view of FIG. 3A, according to another embodiment.

FIGS. 3A-3C are schematic side views of an optical emitter package 1, according to another embodiment. Unless otherwise noted, the components of FIGS. 3A-3C are the same as or similar to like numbered components shown in FIGS. 1A-2C. Unlike the embodiment of FIGS. 1A-2C, however, in FIGS. 3A-3C, the energy storage device 5 may be mounted to the substrate 2 without the use of a second interconnect structure (such as the second interconnect structure 7 of FIGS. 1A-2C). In the embodiment of FIGS. 3A-3C, the substrate 2 can comprise multiple substrate portions 17a, 17b, 17c, which may correspond to electrically separate leads of a leadframe. In addition, the switching die 4 of FIGS. 3A-3C may be flip chip mounted to substrate portion 17b such that the active surface 9 faces the substrate portion 17b. Although only the substrate portions 17a-17c are illustrated, additional substrate portions (e.g., leads or contacts) may be provided at other locations to provide power signals, ground, and/or other electrical functionality to the package 1. Although not shown, the adhesive 8a may include separated electrical connections, such solder balls, for the electrical path to and from the energy storage device 5.

In the embodiment of FIGS. 3A-3C, the current pathway P can pass between the energy storage device 5 and the portion 17a of the package substrate 2, between the portion 17a of the package substrate 2 and the switching die 4, between the switching die 4 and the portion 17c of the package substrate 2, between the portion 17c of the package substrate 2 and the optical emitter die 3, between the optical emitter die 3 and the interconnect structure 6, between the interconnect structure 6 and the switching die 4, between the switching die 4 and the portion 17a of the package substrate 2, and between the portion 17a of the package substrate 2 and the energy storage device 5. In the arrangement of FIGS. 3A-3C, therefore, there may not be a second interconnect structure that connects the energy storage device 5 with the processor 4. Rather, the current may instead pass between the energy storage device 5 and the switching die 4 by way of the portion 17a of the substrate 2. Without being limited by theory, the use of the portion 17a of the substrate 2 (which may comprise a leadframe) may provide reduced inductance as compared with the use of a second interconnect structure, as the leads of a leadframe generally have a greater cross section of leads and therefore reduced inductance than ribbon conductors.

As with FIGS. 1B-1C and 2B-2C, in FIG. 3B, the emitter die 3 (e.g., a laser diode die) can comprise a plurality of terminals on the first side 11 (e.g., a plurality of anodes or a plurality of cathodes), and a single common terminal on the second side 10 (e.g., a single cathode or a single anode). Alternatively, as shown in FIG. 3C, the emitter die 3 (e.g., a laser diode die) can comprise a plurality of terminals on the second side 10 (e.g., a plurality of anodes or a plurality of cathodes), and a single common terminal on the first side 11 (e.g., a single cathode or a single anode).

Figure 4A:
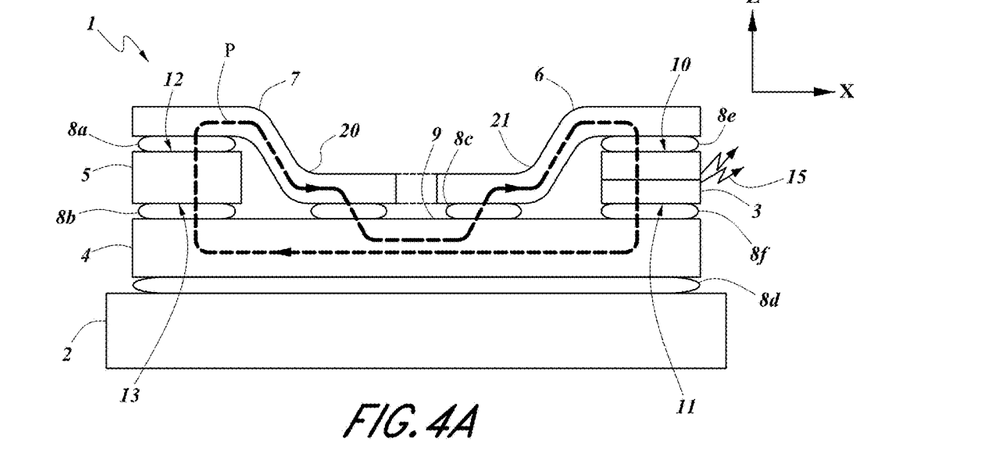
FIG. 4A is a schematic side view of an optical emitter package, according to another embodiment.
Figure 4B:
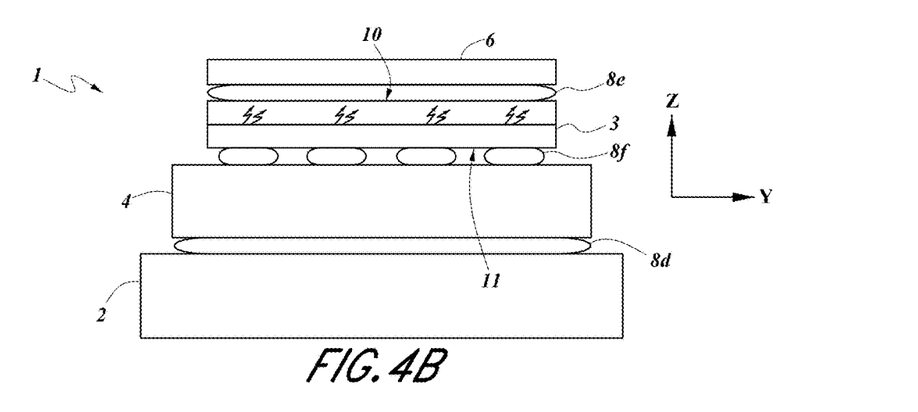
FIG. 4B is a schematic end view of the optical emitter package of FIG. 4A, as viewed from a transverse direction relative to the view of FIG. 4A, according to one embodiment.
Figure 4C:
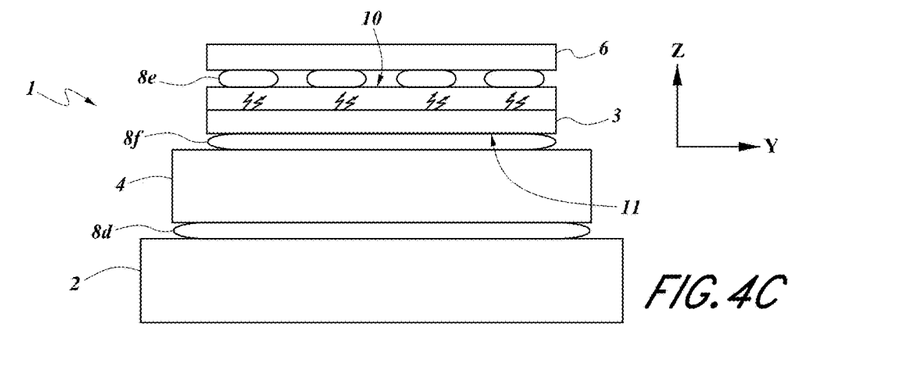
FIG. 4C is a schematic end view of the optical emitter package of FIG. 4A, as viewed from a transverse direction relative to the view of FIG. 4A, according to another embodiment.

FIGS. 4A-4C are schematic side views of an optical emitter package 1, according to another embodiment. Unless otherwise noted, the components of FIGS. 4A-4C are the same as or similar to like numbered components shown in FIGS. 1A-3C. Unlike the embodiments of FIGS. 1A-3C, the switching die 4 can act as a carrier in FIGS. 4A-4C. For example, the switching die 4 can be electrically and mechanically connected to the package substrate 2 by way of through silicon vias (TSVs) and adhesive 8d. In some embodiments, the switching die 4 can be electrically connected to the substrate 2 by wire bonds or other electrical connections. The energy storage device 5 and the optical emitter die 3 (e.g., a laser diode) can be mounted to the active surface 9 of the switching die 4 by way of intervening adhesives 8b, 8f. Moreover, the first and second interconnect structures 6, 7 can comprise a substrate having bends (e.g., a flexible laminate substrate).

For example, the interconnect structure 6 can be mechanically and electrically connected to the active surface 9 of the switching die 4 by way of adhesive 8c. The interconnect structure 6 can be mechanically and electrically connected to the second side 10 of the optical emitter die 3 by way of the adhesive 8e. Similarly, the second interconnect structure 7 can be mechanically and electrically connected to the active surface 9 of the switching die 9 by way of adhesive 8c, and the second interconnect structure 7 can be mechanically and electrically connected to the second side 12 of the energy storage device 5 by way of adhesive 8a. The first and second interconnect structures 6, 7 can comprise interposers or ribbon interconnects that can have corresponding bends 20, 21 that enable the first and second interconnect structures 6, 7 to conform or otherwise be disposed along the active surface 9 of the switching die 4. Advantageously, disposing the first and second interconnect structures 6, 7 along the surface 9 of the switching die 4 can reduce the enclosed area of the current pathway P and/or employ thicker or wider lines as compared with other implementations (e.g., those that utilize bonding wires). Providing a reduced area of the current pathway P can beneficially reduce the overall inductance of the package 1 and improve the operation of the LIDAR device.

Figure 5A:
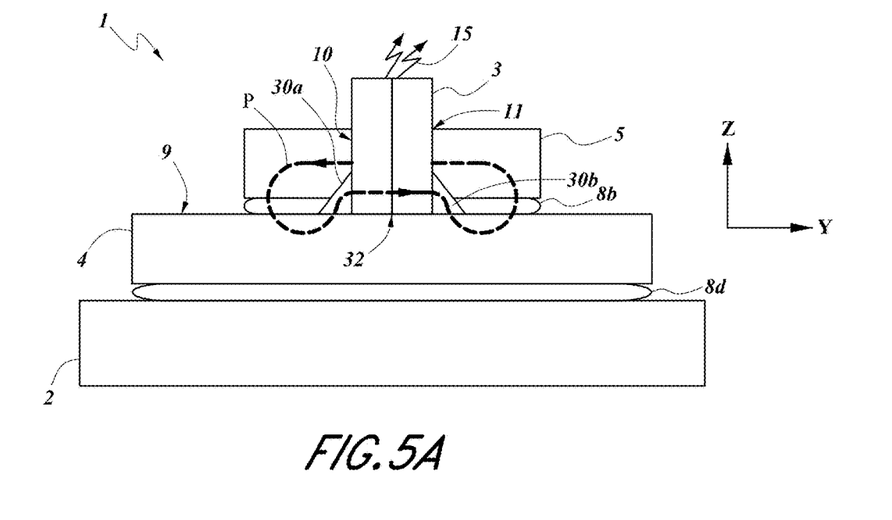
FIG. 5A is a schematic end view of an optical emitter package of FIG. 5A, according to one embodiment.
Figure 5B:
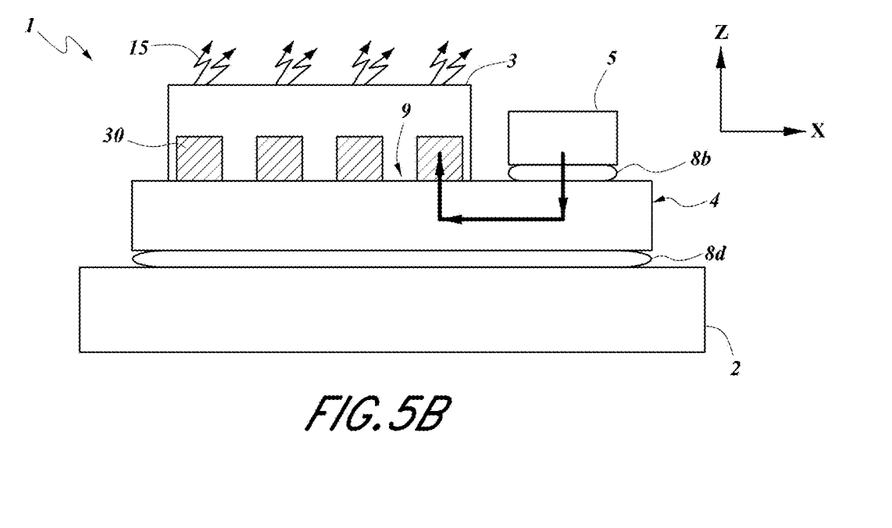
FIG. 5B is a schematic side view of the optical emitter package of FIG. 5A, as viewed from a transverse direction relative to the view of FIG. 5A.

FIGS. 5A-5B are schematic side views of an optical emitter package 1, according to another embodiment. Unless otherwise noted, the components of FIGS. 5A-5B are the same as or similar to like numbered components shown in FIGS. 1A-4C. As with FIGS. 4A-4C, the package 1 of FIGS.

5A-5C can utilize the switching die 4 as the carrier to which the energy storage device 5 and the optical emitter die 3 are mounted. In the embodiments of FIGS. 1A-4C, the optical emitter die 3 is illustrated as being mounted with the first side 11 facing the carrier (whether the carrier comprises the switching die 4 or the substrate 2), and with the light 15 exiting out the side of the package 1 (e.g., along the x-direction). Unlike the embodiments of FIGS. 1A-4C, in FIGS. 5A-4B, the optical emitter die 3 is mounted on a side surface 32 with the first and second sides 11, 10 facing along y-direction. In the illustrated embodiment, the light 15 can be emitted vertically upwardly along the z-direction.

The optical emitter die 3 can be side-mounted by pre-bumping the die 3 while the die 3 lays flat. For example, the die 3 can be pre-bumped with corresponding bumps 30a, 30b, which may comprise solder bumps or another suitable conductive adhesive. When the solder is heated, the bumps 30a, 30b can reflow to form a fillet that mechanically connects the side surface 32 of the optical emitter die 3 to the active surface 9 of the switching die 4. The formation of the solder bumps 30a, 30b can provide electrical communication between the active surface 9 of the switching die 4 and the respective first and second sides 11, 10 of the optical emitter die 3.

In the embodiment of FIGS. 5A-5B, the current pathway P can be formed which provides current between the energy storage device 5 and the switching die 4, between the switching die 4 and the first side 11 of the optical emitter die 3 by way of the bump 30b, between the emitter die 3 and the switching die 4 by way of the bump 30a, and between the switching die 4 and the energy storage device 5. Beneficially, the arrangement of FIGS. 5A-5B may provide electrical communication between the energy storage device 5, the switching die 4, and the emitter die 3 without the use of an external interconnect structure. The inductance of the overall package 1 may be accordingly reduced.

Figure 6:
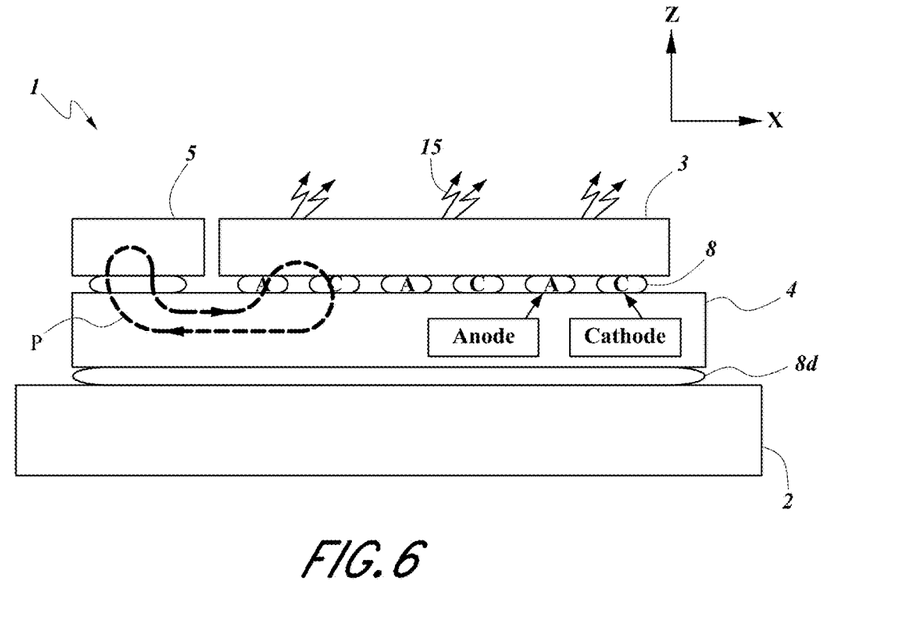
FIG. 6 is a schematic side view of an optical emitter package, according to another embodiment.

FIG. 6 is a schematic side view of an optical emitter package 1, according to another embodiment. Unless otherwise noted, the components of FIG. 6 can be the same as or similar to like numbered components shown in FIGS. 1A-5B. As with FIGS. 5A-5C, in FIG. 6, the switching die 4 serves as a carrier to which the energy storage device 5 and the optical emitter die 3 are mounted. Moreover, as with FIGS. 5A-5C, the emitter die 3 can be configured to emit light 15 along the illustrated vertical or z-direction. For example, in the embodiment of FIG. 6, the emitter die 3 can comprise a vertical cavity surface emission laser (VCSEL) that connects to the switching die 4 by the adhesive 8. The adhesive 8 can connect corresponding bond pads of the switching die 4 to the appropriate anodes A and/ cathodes C of the VCSEL device.

In FIG. 6, the current pathway P can be formed which provides current between the energy storage device 5 and the switching die 4, between the switching die 4 and the optical emitter die 3, between the emitter die 3 and the switching die 4, and between the switching die 4 and the energy storage device 5. By utilizing the switching die 4 to electrically connect the energy storage device 5 with the emitter die 3 (e.g., without separate interconnect structures or bonding wires), the embodiment of FIG. 6 can beneficially reduce overall package inductance.

Figure 7:
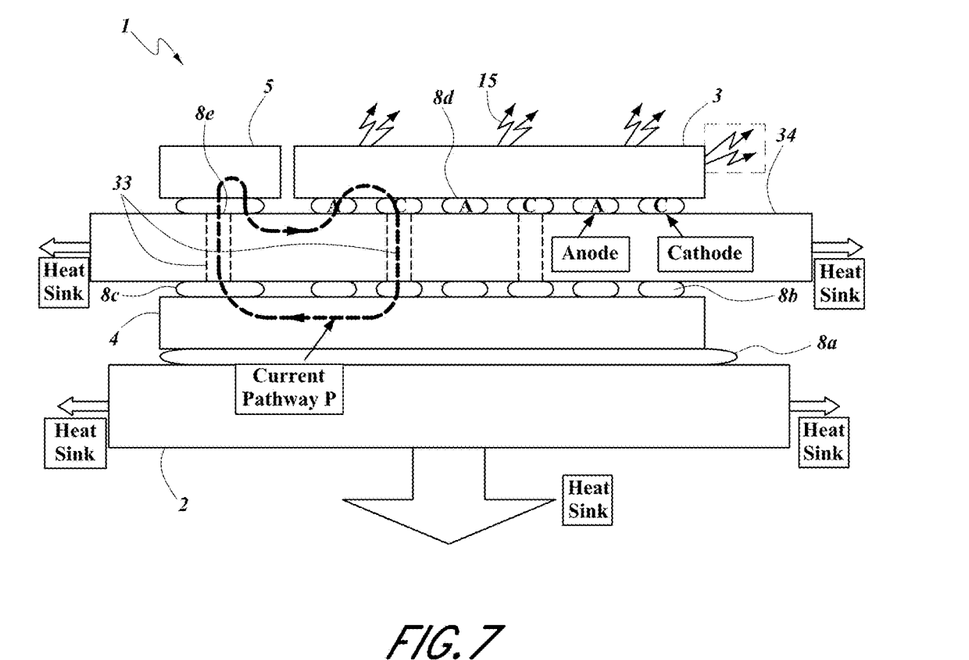
FIG. 7 is a schematic side view of an optical emitter package, according to another embodiment.

FIG. 7 is a schematic side view of an optical emitter package 1, according to another embodiment. Unless otherwise noted, the components of FIG. 7 can be the same as or similar to like numbered components shown in FIGS. 1A-6. For example, the package 1 can comprise a package substrate 2 and a switching die 4 mounted to the package substrate 2 by way of an adhesive 8a, such as a conductive adhesive. The switching die 4 can be flip-chip mounted to an interposer such that bond pads of the switching die 4 electrically connect to conductive lands (e.g., connected to vias 33) of the interposer 34. In the embodiment of FIG. 7, the interposer 34 can electrically and mechanically connect to the switching die 4 opposite the package substrate 2, such that the switching die 4 is disposed between the interposer 34 and the package substrate 2. As explained herein, the interposer 34 can comprise a nonconductive material with electrically interconnects formed therein. In some embodiments, the interposer 34 can comprise a printed circuit board (PCB) substrate. In other embodiments, the interposer 34 can comprise a semiconductor substrate (e.g., silicon), a ceramic, or any other suitable material with embedded conductive interconnects.

An optical emitter die 3 and an energy storage device 5 can be mounted to the interposer 34 opposite the switching die 4, such that the interposer 34 is disposed between the switching die 4 and the optical emitter die 3 and energy storage device 5. The optical emitter die 3 can be any suitable type of emitter. In the illustrated embodiment, the emitter die 3 comprises a VCSEL. The energy storage device 5 can comprise any suitable type of storage device; in FIG. 7, the device 5 comprises a capacitor with both electrodes or poles flip chip connected to the interposer 34. As shown in FIG. 7, the interposer 34 can comprise one or a plurality of conductive vias 33 extending through a thickness of the interposer 34. The vias 33 can provide electrical communication between the energy storage device 5 and the switching die 4 by way of conductive adhesives 8c, 8e. The vias 33 can provide electrical communication between the optical emitter die 3 and the switching die 4 by way of conductive adhesives 8b, 8d. Beneficially, the vias 33 can be sufficiently wide so as to provide a low inductance current pathway P, such as greater than about 50 µm, which can enable fast switching speeds as explained herein. In various embodiments, each via 33 can comprise a plurality of vias provided in parallel, which can provide equivalent conduction to a single wide via, and thus also reduce the overall package inductance and, therefore, switching speeds. As shown the current pathway P can provide current between the energy storage device 5 and the interposer 34, between the interposer and the optical emitter die 3, between the optical emitter die 3 and the switching die 4 by way of the relatively wide vias 33 and/or relatively wide surface traces on either face of the interposer 34, and between the switching die 4 and the energy storage device 5 by way of the vias 33 and surface/or traces on either face of the interposer 34.

Further, the embodiment shown in FIG. 7 can advantageously provide additional heat sinking functionality. For example, the interposer 34 can have a relatively high bulk thermal conductivity (such as aluminum nitride) and can comprise thermally conductive structures therein so as to conduct heat away from the optical emitter die 3 and the switching die 4 to the outside environs. In some embodiments, the interposer 34 can comprise thermally-conductive pathways to one or more heat sinks (e.g., a finned heat sink, or the interposer 34 can be bonded with low thermal impedance to a regulated thermal sink) to dissipate heat to the outside environs. In various embodiments, the interposer 34 may also transfer heat from the switching die 4 to the outside environs and/or to the one or more heat sinks. Thus, the interposer 34 disclosed in FIG. 7 can beneficially provide a reduced inductance current pathway P for reduced switching speeds and a thermally conductive pathway for improved heat dissipation.

Figure 8A:
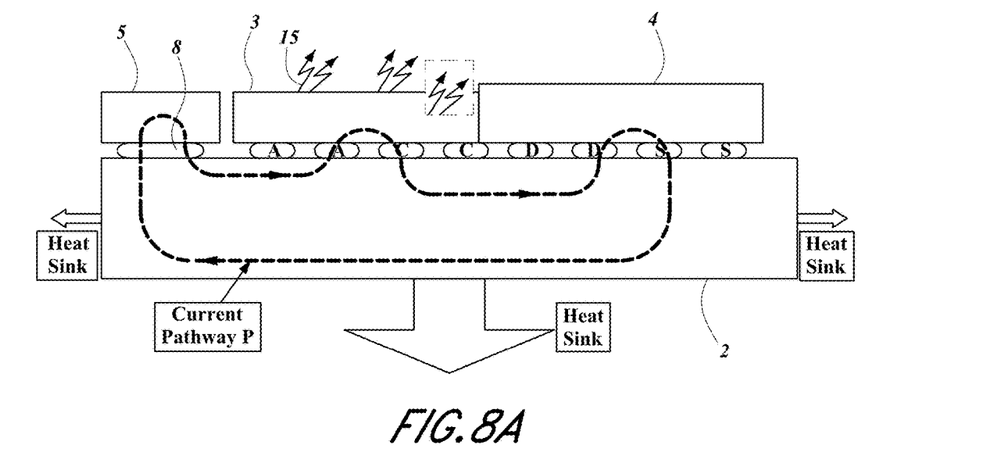
FIG. 8A is a schematic side view of an optical emitter package, according to another embodiment.
Figure 8B:
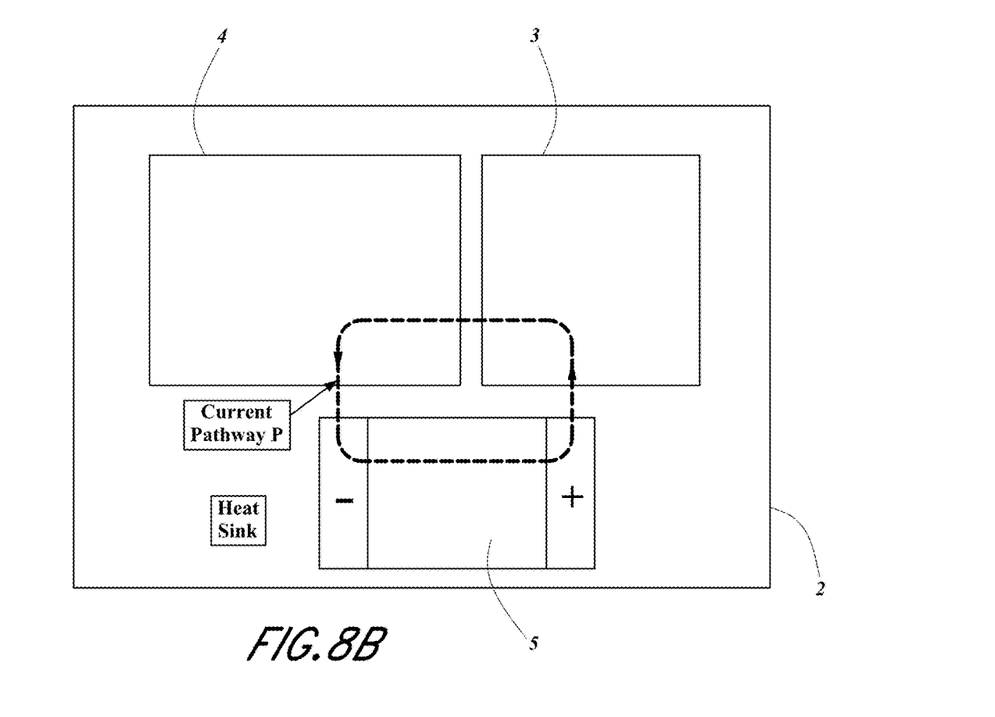
FIG. 8B is a schematic top plan view of the package of FIG. 8A.

FIG. 8A is a schematic side view of an optical emitter package 1, according to another embodiment. FIG. 8B is a schematic top plan view of the package 1 of FIG. 8A. Unless otherwise noted, the components of FIGS. 8A-8B can be the same as or similar to like numbered components shown in FIGS. 1A-7. In the embodiment of FIGS. 8A-8B, an optical emitter die 3, a switching die 4, and an energy storage device 5 can be mounted laterally adjacent one another on a package substrate 2. The substrate 2 can provide relatively wide traces for low-inductance electrical routing among the components 3, 4, and 5. In the side view of FIG. 8A, the emitter die 3 is illustrated as extending laterally beyond the switching die 4 for ease of illustrating both dies 3, 4 in the side view. However, in some embodiments, as shown in the top view of FIG. 8B, the dies 3, 4 may be laterally aligned when viewed from the side. The optical emitter die 3, the switching die 4, and the energy storage device 5 can be directly electrically and mechanically connected to the package substrate 2 by way of respective flip chip bonding techniques. For example, the optical emitter die 3, the switching die 4, and the energy storage device 5 can be flipped such that bond pads on the active surfaces are bonded to the substrate 2 with solder or other electrically conductive adhesives. In some embodiments, there may also be underfill materials between the devices and the package substrate 2. As explained above, the energy storage device 5 can comprise any suitable type of storage device, such as a capacitor. The optical emitter die 3 can comprise any suitable type of emitter as explained above.

The package 1 of FIGS. 8A-8B can operate in a similar manner as explained above to provide a low inductance current pathway P and high switching speeds during operation. Beneficially, the substrate 2 can comprise relatively wide traces or sheets of conductive material to route the signals with low inductance. The wide sheet(s) of conductive material can be sufficiently wide so as to provide a low inductance pathway, e.g., the sheet(s) of conductive material can have minimum widths in a range of 50 µm to 2 mm, in a range of 50 µm to 1 mm, in a range of 100 µm to 2 mm, in a range of 100 µm to 1 mm, in a range of 250 µm to 2 mm, in a range of 250 µm to 1 mm, or in a range of 500 µm to 2 mm. In various embodiments, the minimum width(s) of the conductive sheet(s) can be greater than 40 µm, greater than 50 µm, greater than 100 µm, greater than 250 µm, or greater than 500 µm. In comparison to bond wires, the traces provide low-inductance routing among the devices of the package. In some embodiments, the substrate 2 can comprise a PCB substrate. In some embodiments, the substrate 2 can comprise a semiconductor or ceramic substrate with embedded interconnects. As shown in FIGS. 8A-8B, the conductive pathway P can provide current between the energy storage device 5 and the package substrate 2, between the package substrate 2 and the optical emitter die, between the optical emitter die 3 and the package substrate 2, between the package substrate 2 and the switching die 4, and between the switching die 4 and the package substrate 2, and between the package substrate 2 and the energy storage device 5. The portion of the current pathway P within the package substrate 2 can be provided by the relatively wide conductive sheets to provide a low inductance current path and high switching speeds. The substrate 2 can also comprise materials with relatively high thermal conductivity with one or more heat sinks bonded or otherwise applied to any available surface to conduct heat away from the package components.

Devices employing the above described schemes can be mounted into various electronic devices, e.g., by way of a motherboard or system board. Examples of the electronic devices can include, but are not limited to, consumer electronic products, parts of the consumer electronic products, electronic test equipment, etc. Examples of electronic products can include, but are not limited to, a gaming device, a mobile phone, a computer, a hand-held or tablet computer, a personal digital assistant (PDA), an automobile, a multi-functional peripheral device, medical devices, an automobile, etc. Further, the electronic device can include unfinished products.

Although disclosed in the context of certain embodiments and examples, it will be understood by those skilled in the art that the present invention extends beyond the specifically disclosed embodiments to other alternative embodiments and/or uses and obvious modifications and equivalents thereof. In addition, while several variations have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the present disclosure. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the aspects that follow.

What is claimed is:

1. A low-inductance optical emitter package comprising:
a carrier;
an optical emitter die mounted directly to the carrier using a conductive material, the optical emitter die electrically and mechanically connected to the carrier with the conductive material;
a switching die configured to switch a current to the optical emitter die on and off; and
an energy storage device mounted to the carrier, the energy storage device electrically and mechanically connected to the carrier with a second conductive material,
wherein the carrier provides electrical communication among the switching die, the optical emitter die, and the energy storage device.

2. The package of claim 1, further comprising an interconnect structure comprising a conductive trace, the interconnect structure electrically connecting to the optical emitter die by a third conductive material and to the switching die by a fourth conductive material.

3. The package of claim 1, wherein the carrier comprises an interposer disposed between the switching die and the optical emitter die.

4. The package of claim 3, further comprising a current pathway between the energy storage device and the interposer, between the interposer and the optical emitter die, between the optical emitter die and the switching die, and between the switching die and the energy storage device.

5. The package of claim 1, wherein the switching die is flip-chip mounted to the carrier or flip-chip mounted to an interposer disposed between the switching die and the optical emitter die.

6. The package of claim 1, further comprising a current pathway between the energy storage device and the carrier, between the carrier and the optical emitter die, between the optical emitter die and the carrier, between the carrier and the switching die, between the switching die and the carrier, and between the carrier and the energy storage device.

7. An optical emitter package comprising:
a carrier;
an interconnect structure comprising a conductive trace;
a switching die; and
an optical emitter die having a first side and a second side opposite the first side, the first side of the optical emitter die mechanically and electrically connected to the carrier with a conductive material, the second side of the optical emitter die mechanically and electrically connected to the interconnect structure with a second conductive material, wherein the interconnect structure provides electrical communication between the switching die and the optical emitter die.

8. The package of claim 7, further comprising an energy storage device mounted to the carrier, the energy storage device being in electrical communication with the switching die and the optical emitter die.

9. The package of claim 8, wherein the interconnect structure is a first interconnect structure and the package further comprises a second interconnect structure, wherein a first side of the energy storage device is mechanically and electrically connected to the carrier and a second side of the energy storage device is mechanically and electrically connected to the second interconnect structure.

10. The package of claim 9, wherein the first interconnect structure is mechanically and electrically connected to the switching die.

11. The package of claim 9, further comprising a current pathway passing between the energy storage device and the second interconnect structure, between the second interconnect structure and the switching die, between the switching die and the first interconnect structure, between the first interconnect structure and the optical emitter die, between the optical emitter die and the carrier, and between the carrier and the energy storage device.

12. The package of claim 9, further comprising a current pathway passing between the energy storage device and the second interconnect structure, between the second interconnect structure and the switching die, between the switching die and the first interconnect structure, between the first interconnect structure and the optical emitter die, between the optical emitter die and the carrier, between the carrier and the switching die, between the switching die and the second interconnect structure, and between the second interconnect structure and the energy storage device.

13. The package of claim 8, further comprising a current pathway passing between the energy storage device and the carrier, between the carrier and the switching die, between the switching die and the carrier, between the carrier and the optical emitter die, between the optical emitter die and the interconnect structure, between the interconnect structure and the switching die, between the switching die and the carrier, and between the carrier and the energy storage device.

14. The package of claim 7, wherein the switching die is configured to switch a current to the optical emitter on and off.

15. The package of claim 7, wherein the switching die is flip-chip mounted to the carrier or flip-chip mounted to an interposer disposed between the switching die and the optical emitter die.

16. The package of claim 7, wherein the switching die and the optical emitter die are mounted adjacent one another on the carrier.

17. A low-inductance optical emitter package comprising:
a switching die;
an energy storage device mechanically and electrically connected to the switching die by way of a first conductive material; and
an optical emitter mounted directly to the switching die using a second conductive material, the optical emitter die mechanically and electrically connected to the switching die with the second conductive material,
wherein the switching die provides electrical communication between the energy storage device and the optical emitter die and is configured to switch a current to the optical emitter die on and off.

18. The package of claim 17, further comprising:
at least one interconnect structure comprising a conductive trace, the at least one interconnect structure electrically connecting to the optical emitter die by a third conductive material, to the energy storage device by a fourth conductive material, and to the switching die by a fifth and sixth conductive material; and
a current pathway passing between the energy storage device and the at least one interconnect structure, between the at least one interconnect structure and the switching die, between the switching die and the at least one interconnect structure, between the at least one interconnect structure and the optical emitter die, between the optical emitter die and the switching die, and between the switching die and the energy storage device.

19. The package of claim 17, wherein the optical emitter die is edge-mounted to the switching die.

20. The package of claim 17, further comprising a current pathway passing between the energy storage device and the switching die, between the switching die and the optical emitter die, between the optical emitter die and the switching die, and between the switching die and the energy storage device.

21. A low-inductance optical emitter package comprising:
an optical emitter die configured to emit at least one optical pulse;
a switching die, in electrical communication with the optical emitter die, configured to switch a current to the optical emitter on and off; and
low-inductance connecting means for forming a low-inductance conductive path between the emitting means and the high-speed switching means.

22. The package of claim 21, wherein the switching die is configured to switch the current to the optical emitter die with a switching speed in a range of 50 ps to 5 ns.

23. The package of claim 21, wherein the switching die is configured to switch the current to the optical emitter die with a switching speed less than 15 ns.

24. The package of claim 21, wherein the optical emitter die is configured to emit an optical pulse with a peak power above 80 W.

* * * * *